United States Patent
Tsai

(10) Patent No.: US 11,674,830 B2
(45) Date of Patent: Jun. 13, 2023

(54) SENSOR AND INTEGRATED CIRCUIT MODULE

(71) Applicant: NUVOTON TECHNOLOGY CORPORATION, Hsinchu Science Park (TW)

(72) Inventor: Ming-Chih Tsai, Taichung (TW)

(73) Assignee: NUVOTON TECHNOLOGY CORPORATION, Hsinchu Science Park (TW)

( * ) Notice: Subject to any disclaimer, the term of this patent is extended or adjusted under 35 U.S.C. 154(b) by 721 days.

(21) Appl. No.: 16/732,116

(22) Filed: Dec. 31, 2019

(65) Prior Publication Data

US 2021/0063212 A1 Mar. 4, 2021

(30) Foreign Application Priority Data

Aug. 29, 2019 (TW) .................................. 108130945

(51) Int. Cl.
*G01D 11/24* (2006.01)

(52) U.S. Cl.
CPC .................................. *G01D 11/245* (2013.01)

(58) Field of Classification Search
CPC .................................................. G01D 11/245
See application file for complete search history.

(56) References Cited

U.S. PATENT DOCUMENTS

| | | | | |
|---|---|---|---|---|
| 5,691,480 A * | 11/1997 | Cook, Sr. | ............ | G01L 19/0038 73/756 |
| 8,322,225 B2 * | 12/2012 | Bentley | ................ | G01L 19/148 73/754 |
| 8,476,720 B2 * | 7/2013 | Liu | ........................ | H05K 1/181 257/737 |
| 8,770,034 B2 * | 7/2014 | Bentley | ................. | G01L 9/0054 73/715 |
| 10,247,629 B2 * | 4/2019 | Chiou | .................... | G01L 9/0073 |
| 2002/0132361 A1 | 9/2002 | Vossmeyer et al. | | |
| 2005/0057129 A1 * | 3/2005 | Bober | ..................... | A47B 51/00 348/E5.128 |
| 2009/0282917 A1 * | 11/2009 | Acar | ................... | G01C 19/5719 438/109 |

(Continued)

FOREIGN PATENT DOCUMENTS

| | | |
|---|---|---|
| TW | 563900 U | 11/2003 |
| TW | M569074 U | 10/2018 |

OTHER PUBLICATIONS

Office Action of TW Application No. 108130945, dated Apr. 30, 2020, 5 pages.

(Continued)

*Primary Examiner* — Jamel E Williams
(74) *Attorney, Agent, or Firm* — Muncy, Geissler, Olds & Lowe, P.C.

(57) ABSTRACT

A sensor is provided and is disposed on a package body of an integrated circuit chip. The sensor includes a sensing element, a protective element, a cover, and at least two traces. The sensing element is disposed on the integrated circuit chip. The protective element is disposed on the integrated circuit chip and surrounds the sensing element. The cover is connected to the protective element. The at least two traces are electrically connected to the sensing element and to at least two pins of the integrated circuit chip.

20 Claims, 15 Drawing Sheets

(56) References Cited

U.S. PATENT DOCUMENTS

| | | | | |
|---|---|---|---|---|
| 2012/0112365 A1* | 5/2012 | Ausserlechner | ....... | G01R 15/20 |
| | | | | 438/126 |
| 2013/0001709 A1* | 1/2013 | Liu | ........................ | H05K 1/181 |
| | | | | 438/48 |
| 2014/0083209 A1* | 3/2014 | Wade | ........................ | G01L 1/26 |
| | | | | 73/862.381 |
| 2018/0313709 A1* | 11/2018 | Chiou | ................... | G01L 9/0073 |
| 2019/0072530 A1 | 3/2019 | Yan et al. | | |
| 2020/0284677 A1* | 9/2020 | Wagner | .............. | G01L 19/0038 |

OTHER PUBLICATIONS

Office Action dated Jun. 23, 2021 in related U.S. Appl. No. 16/999,936, 14 pages.
Office Action dated Dec. 21, 2021 in related U.S. Appl. No. 16/999,936, 14 pages.

* cited by examiner

SENSOR AND INTEGRATED CIRCUIT MODULE

CROSS REFERENCE TO RELATED APPLICATIONS

This application claims the benefit of TW Patent Application No. 108130945, filed Aug. 29, 2019, the entirety of which is incorporated by reference herein.

BACKGROUND OF THE DISCLOSURE

Field of the Disclosure

The present disclosure relates to a sensor, and in particular it relates to a sensor capable of being added on an integrated circuit (IC) chip.

Description of the Related Art

As technology has developed, many of today's electronic devices (such as tablet computers and smartphones) now have one or more sensors configured to sense various environmental messages, such as temperature, humidity, air flow, and so on.

When an assessment of environmental conditions is needed, the sensors with an environment-sensing function have to be in direct contact with the surrounding environment, so most of these type of sensors need special customized packaging to perform their environment-sensing function. By the special packaging, the integrated circuit chip is open to the outside environment, so as to achieve the purpose of detection. However, the outer layer of the integrated circuit chip is directly exposed to the surrounding environment, which can make it difficult to avoid failure of the elements due to environmental factors in the future. Furthermore, the cost and complexity of processing the special packaging is always higher than for conventional standard packaging, and no other proposal can replace it, so that the cost of such sensors cannot be lowered.

Therefore, how to design a sensor without the expensive special packaging, capable of completely keeping all the characteristics of a packaged integrated circuit, and capable of addressing the risk of exposure in the surrounding environment are topics nowadays that need to be discussed and solved.

BRIEF SUMMARY OF THE DISCLOSURE

Accordingly, one objective of the present disclosure is to provide a sensor to solve the above problems.

According to some embodiments of the disclosure, a sensor is provided and is disposed on a package body of an integrated circuit chip. The sensor includes a sensing element, a protective element, a cover, and at least two traces. The sensing element is disposed on the integrated circuit chip. The protective element is disposed on the integrated circuit chip and surrounds the sensing element. The cover is connected to the protective element. The at least two traces are electrically connected to the sensing element and to at least two pins of the integrated circuit chip.

According to some embodiments of the disclosure, the sensor further includes two connecting ends respectively connected to the two traces, wherein each of the connecting ends includes a pad, a bump, and a conductive paste, the trace is connected to the pad, the bump is connected to the pad, and the conductive paste is connected to the bump and one pin of the integrated circuit chip.

According to some embodiments of the disclosure, the sensor further includes a bottom plate configured to support the sensing element and connected to the protective element, an accommodating space is formed by the cover, the protective element and the bottom plate to accommodate the sensing element, and an opening is formed on the cover.

According to some embodiments of the disclosure, the sensor further includes a thin film element disposed between the cover and the bottom plate, and the thin film element is disposed on the cover and covers the opening.

According to some embodiments of the disclosure, the two connecting ends and the sensing element are located on opposite sides of the bottom plate.

According to some embodiments of the disclosure, the sensor further includes a bottom plate configured to support the sensing element and connected to the protective element, an accommodating space is formed by the cover, the protective element and the bottom plate to accommodate the sensing element, and the two connecting ends and the sensing element are located on a same side of the bottom plate.

According to some embodiments of the disclosure, the protective element includes a connecting portion and a thin film element, the connecting portion is disposed on the bottom plate, and the thin film element is connected between the connecting portion and the cover.

According to some embodiments of the disclosure, the protective element includes a connecting portion and two thin film elements, the connecting portion has a rectangular structure and two openings which are located on opposite sides of the rectangular structure, and the two thin film elements are respectively disposed in the two openings.

According to some embodiments of the disclosure, the sensing element includes a die or a plurality of wires.

According to some embodiments of the disclosure, an integrated circuit module is provided and includes a integrated circuit chip and a sensor. The integrated circuit chip has a package body and at least two pins. The sensor is disposed on the integrated circuit chip, and the sensor includes a bottom plate, sensing element, a protective element, at least two traces and two connecting ends. The sensing element is disposed on the bottom plate. The protective element is disposed on the bottom plate and surrounding the sensing element. The at least two traces are connected to the sensing element. The two connecting ends are electrically connected to the at least two traces. The two connecting ends are configured to be connected to the at least two pins of the integrated circuit chip.

According to some embodiments of the disclosure, the protective element is connected between the bottom plate and the package body, and the protective element, the bottom plate and the package body form an accommodating space to accommodate the sensing element.

According to some embodiments of the disclosure, the protective element includes a connecting portion and a thin film element, the connecting portion is disposed on the bottom plate, and the thin film element is connected to the connecting portion and is located in the connecting portion.

According to some embodiments of the disclosure, the protective element includes a connecting portion and two thin film elements, the connecting portion has a rectangular structure and two openings which are located on opposite sides of the rectangular structure, and the two thin film elements are respectively disposed in the two openings.

According to some embodiments of the disclosure, the sizes of the two openings are different.

According to some embodiments of the disclosure, an arrangement direction of the two openings is substantially the same as an arrangement direction of the two pins.

According to some embodiments of the disclosure, an arrangement direction of the two openings is substantially different from an arrangement direction of the two pins.

According to some embodiments of the disclosure, the thin film element is made out of paper, glass fibers, metal oxides, polypropylene (PP), nanocellulose, cellulose acetate (CA), polysulfone (PSU), fluoropolymer, polyvinylamine, polyamide (PA), polyimide (PI), polyfuran (PFu), polydimethylsiloxane (PDMS), poly [1-(trimethylsilyl)-1-propyne] (PTMSP), or a combination thereof.

According to some embodiments of the disclosure, the two connecting ends and the sensing element are located on a same side of the bottom plate.

According to some embodiments of the disclosure, the sensing element includes a die or a plurality of wires.

According to some embodiments of the disclosure, each of the connecting ends includes a pad, a bump, and a conductive paste, the trace is connected to the pad, the bump is connected to the pad, and the conductive paste is connected to the bump and one of the two pins.

The present disclosure provides a modular sensor that is detachably attached to an integrated circuit chip, such as on the package body of the integrated circuit chip. Because the sensor is detachably attached to the integrated circuit chip, that is, it is not necessary to use a special packaging to bond the integrated circuit chip and the sensor. Therefore, the sensor of the present disclosure not only can be protected well, but also the original size of the integrated circuit chip can be maintained, so as to achieve the purpose of miniaturization.

In addition, when the sensor malfunctions, the faulty sensor can easily be replaced with a new sensor. Therefore, the sensor of the present disclosure has the advantages of cost saving and replacement convenience as compared with the conventional special packaging sensor.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION OF THE ILLUSTRATIVE EMBODIMENTS

Figure 1:
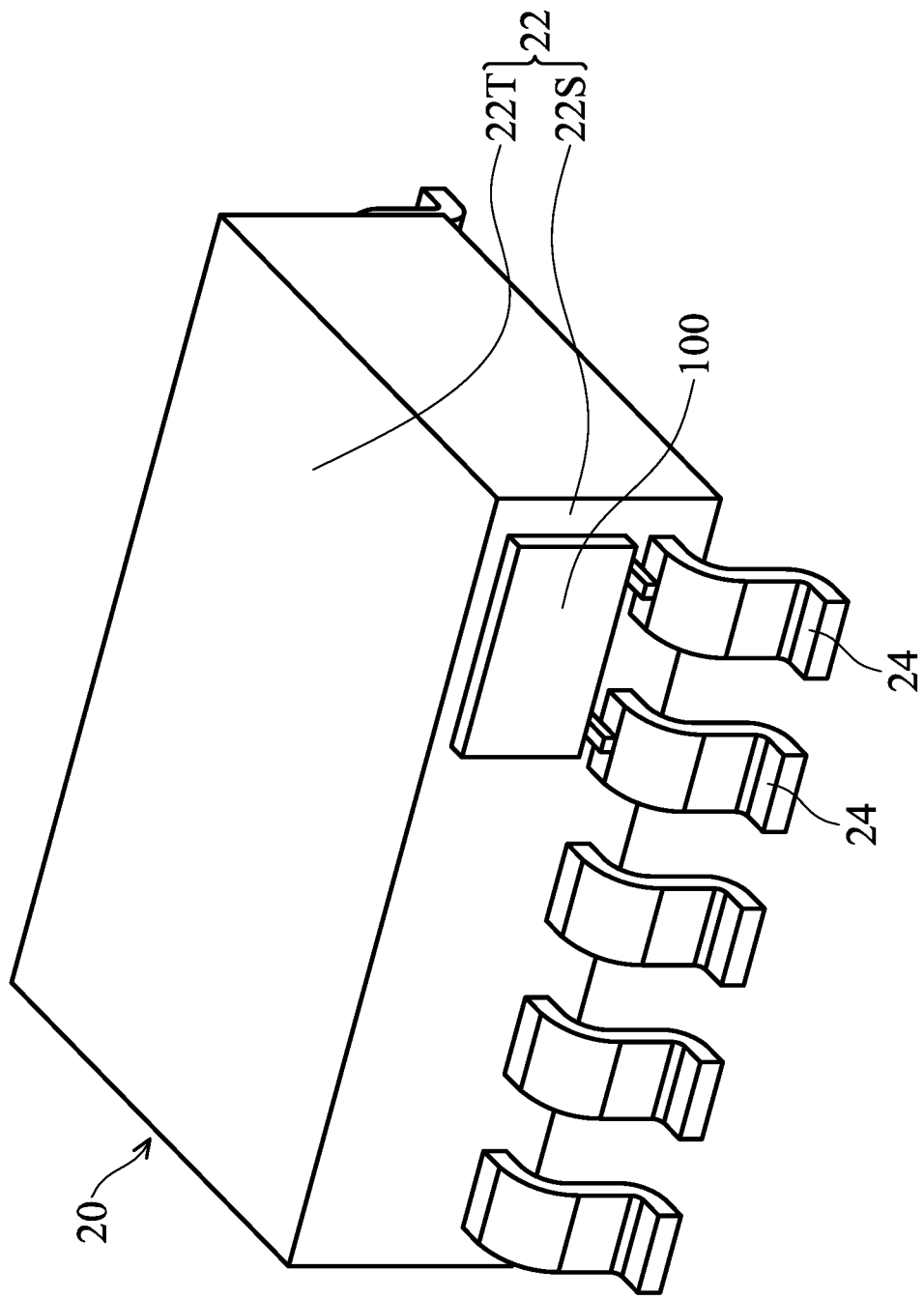
FIG. 1 is a schematic diagram of an integrated circuit module 10 of according to an embodiment of the present disclosure.

In the following detailed description, for the purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept can be embodied in various forms without being limited to those exemplary embodiments. In addition, the drawings of different embodiments can use like and/or corresponding numerals to denote like and/or corresponding elements in order to clearly describe the present disclosure. However, the use of like and/or corresponding numerals in the drawings of different embodiments does not suggest any correlation between different embodiments. The directional terms, such as "up", "down", "left", "right", "front" or "rear", are reference directions for accompanying drawings. Therefore, using the directional terms is for description instead of limiting the disclosure.

It should be understood that component for specific description or specific figures can be present in any form with which a skilled person is familiar. In addition, when a layer is "above" other layers or a substrate, it might be "directly" on the layers or the substrate, or some other layers may be between the layer and the other layers.

In this specification, relative expressions are used. For example, "lower", "bottom", "higher" or "top" are used to describe the position of one element relative to another. It should be appreciated that if a device is flipped upside down, an element at a "lower" side will become an element at a "higher" side.

The terms "about" and "substantially" typically mean +/−20% of the stated value, more typically +/−10% of the stated value and even more typically +/−5% of the stated value. The stated value of the present disclosure is an approximate value. When there is no specific description, the stated value includes the meaning of "about" or "substantially".

Please refer to FIG. 1, which is a schematic diagram of an integrated circuit module 10 of according to an embodiment of the present disclosure. The integrated circuit module 10 includes an integrated circuit chip 20 which is packaged, and the integrated circuit chip 20 can be disposed in an electronic device (such as a smartphone or notebook computer) and is configured to receive, transmit signals or operation. The integrated circuit chip 20 may have a package body 22 and a plurality of pins 24. Furthermore, in this embodiment, the integrated circuit module 10 may further includes a sensor 100 which is added on a side surface 22S of the package body 22, and the sensor 100 is electrically connected to two pins 24. Position of the sensor 100 is not limited thereto, and in other embodiments, the sensor 100 may be disposed on a top surface 22T of the package body 22.

Figure 2:
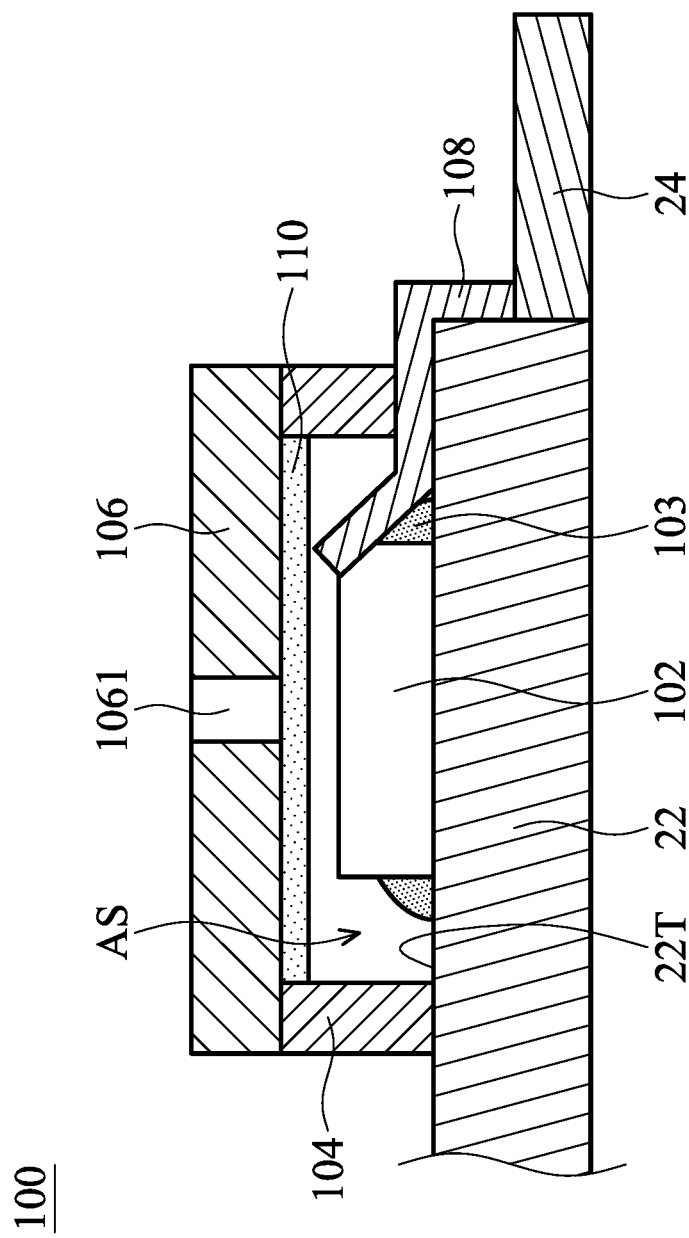
FIG. 2 is a side view of the sensor 100 according to an embodiment of the present disclosure.
Figure 3:
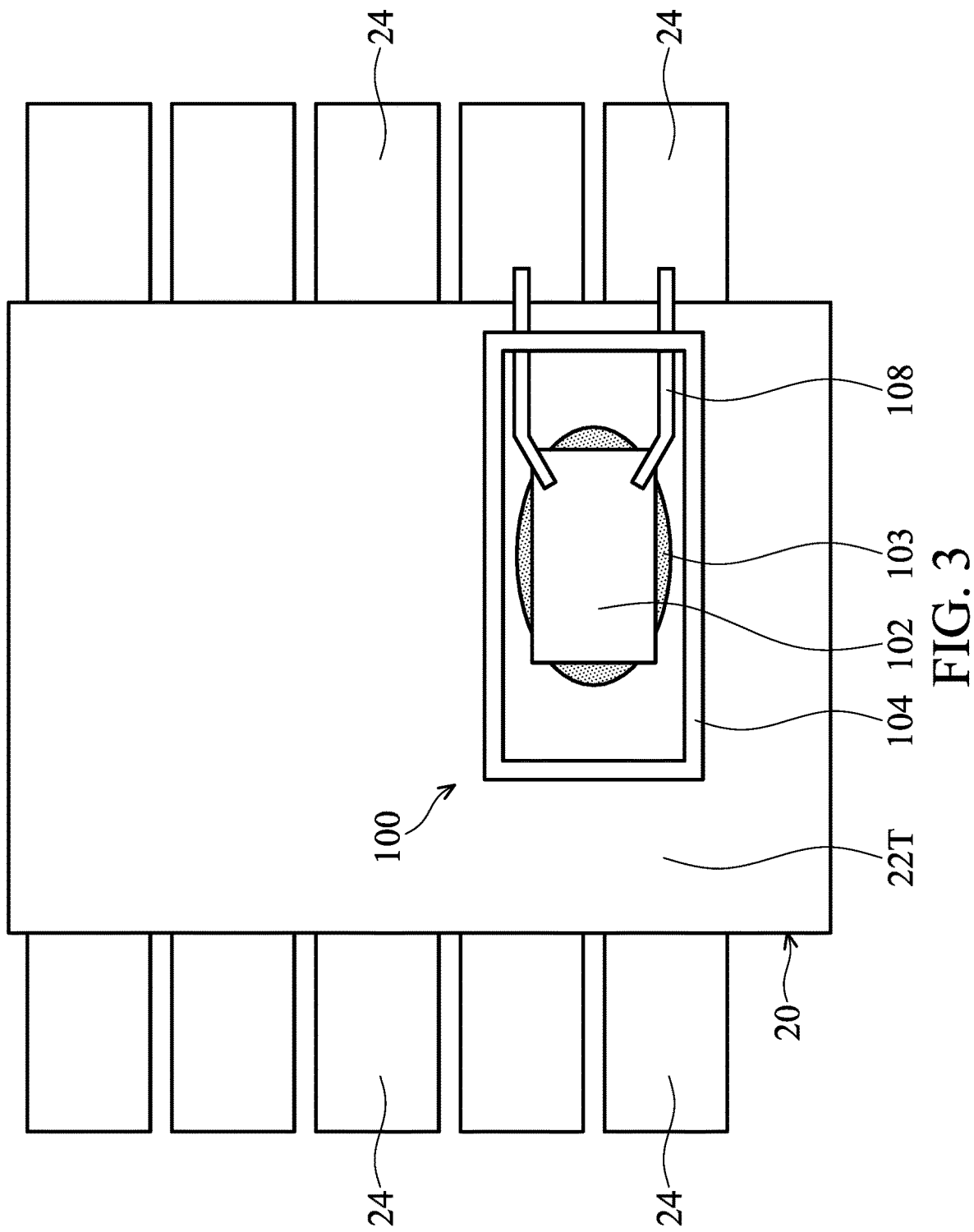
FIG. 3 is diagram of the sensor 100 disposed on the top surface 22T of the integrated circuit chip 20 according to an embodiment of the present disclosure.

Next, please refer to FIG. 2 and FIG. 3. FIG. 2 is a side view of the sensor 100 according to an embodiment of the present disclosure, and FIG. 3 is diagram of the sensor 100 disposed on the top surface 22T of the integrated circuit chip 20 according to an embodiment of the present disclosure. In this embodiment, the sensor 100 includes a sensing element 102, a protective element 104, a cover 106, and two traces 108. The sensing element 102 may be a die, fixedly disposed on the top surface 22T of the package body 22 by adhesive 103.

The protective element 104 may be a glue or a resin, such as acrylic, epoxy, polyvinyl acetate, polychloroprene, polyurethane, polystyrene, unsaturated polyester, silicone, or a combination thereof, but it is not limited thereto. The protective element 104 is disposed on the integrated circuit chip 20 and surrounds the sensing element 102. The protective element 104 is connected to the cover 106, and the traces 108 are electrically connected to the sensing element 102 and two pins 24 of the integrated circuit chip 20. In this embodiment, the traces 108 can be implemented by using additive manufacturing (also known as 3D printing) technology, but it is not limited thereto.

As shown in FIG. 2, an accommodating space AS is formed by the cover 106, the protective element 104 and the top surface 22T to accommodate the sensing element 102 and a portion of the traces 108. An opening 1061 is formed on the cover 106, and the sensing element 102 can sense the conditions of the environment in which the sensor 100 is located via the opening 1061.

Furthermore, in one embodiment, the sensor 100 may further include a thin film element 110, covered on the opening 1061, and the thin film element 110 is disposed between the cover 106 and a bottom plate 112. The thin film element 110 may be made of a paper, glass fibers, metal oxides, polypropylene (PP), nanocellulose, cellulose acetate (CA), polysulfone (PSU), fluoropolymer, polyvinylamine, polyamide (PA), polyimide (PI), polyfuran (PFu), polydimethylsiloxane (PDMS), poly [1-(trimethylsilyl)-1-propyne] (PTMSP), or a combination thereof, and the thin film element 110 may prevent the sensing element 102 from becoming damaged due to direct exposure to the environment.

Figure 4:
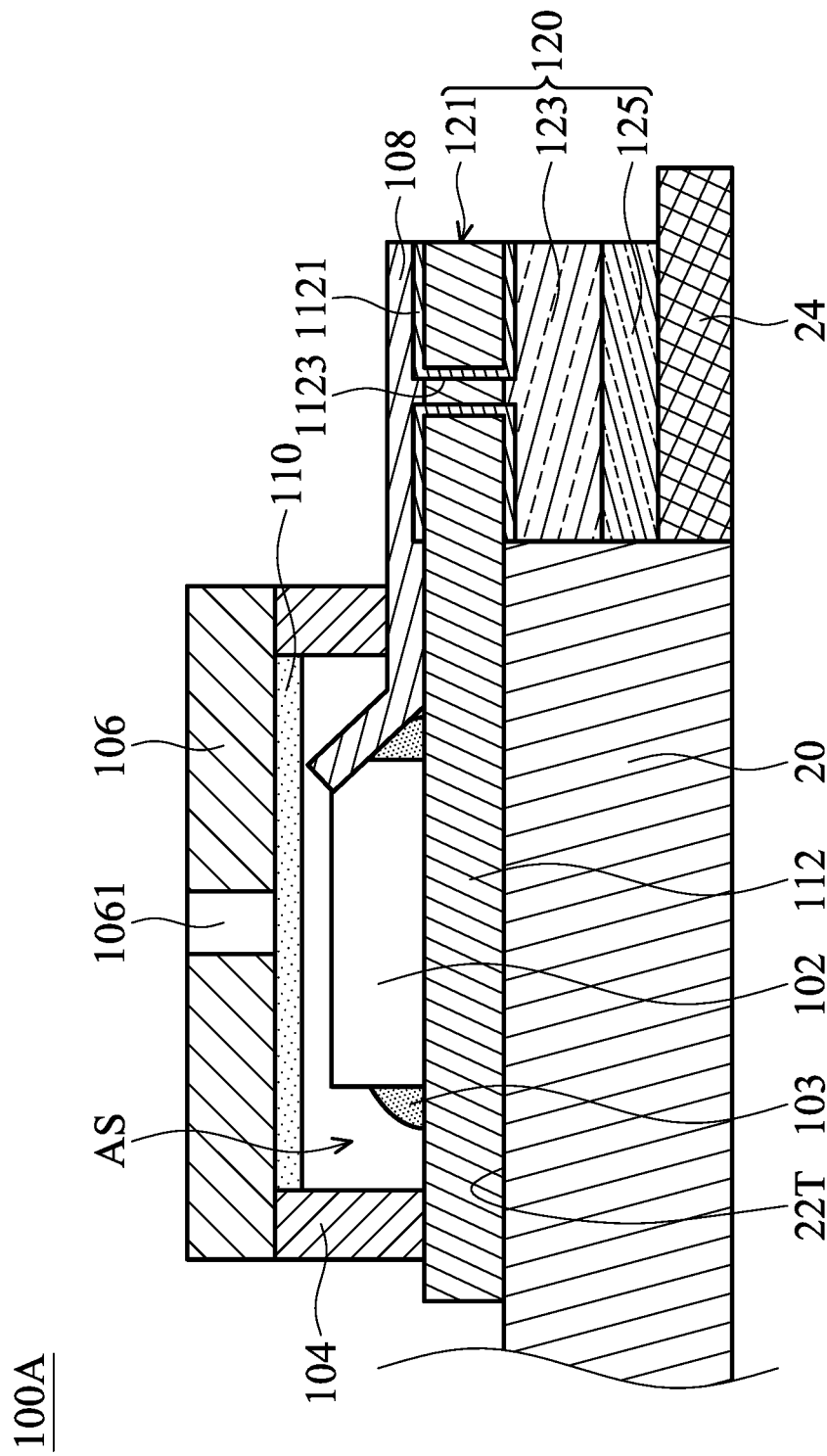
FIG. 4 is a side view of a sensor 100A according to an embodiment of the present disclosure.
Figure 5:
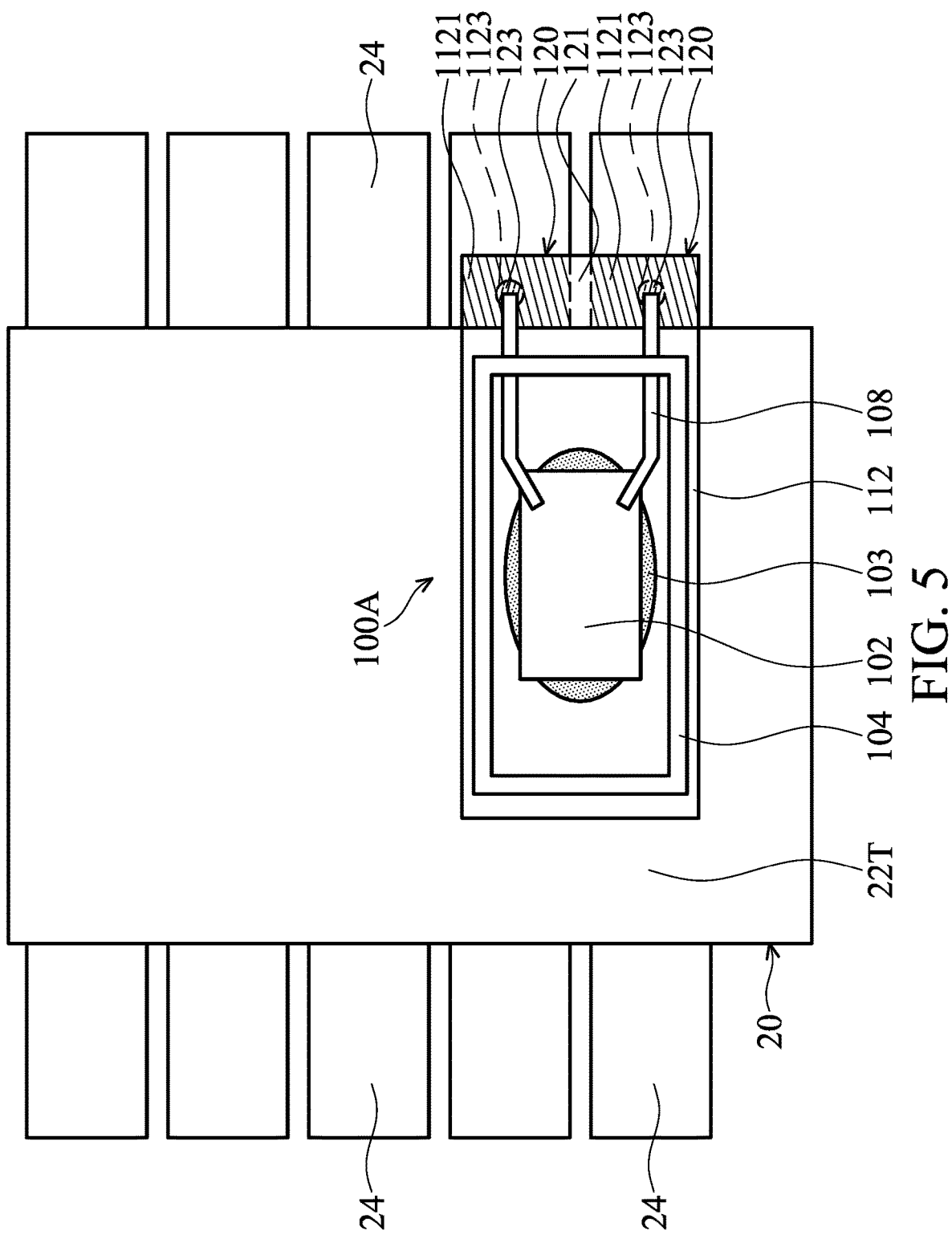
FIG. 5 is a diagram of the sensor 100A disposed on the top surface 22T of the integrated circuit chip 20 according to an embodiment of the present disclosure.

Please refer to FIG. 4 and FIG. 5. FIG. 4 is a side view of a sensor 100A according to an embodiment of the present disclosure, and FIG. 5 is a diagram of the sensor 100A disposed on the top surface 22T of the integrated circuit chip 20 according to an embodiment of the present disclosure. The cover 106 is omitted in FIG. 5 for clarity. The structure of the sensor 100A is similar to that of the sensor 100, and in this embodiment, the sensor 100A may further include a bottom plate 112 configured to support the sensing element 102 and connect to the protective element 104. The sensing element 102 can also be fixed on the bottom plate 112 by the adhesive 103, and a metal conductive layer 1121 and a through hole via 1123 can be formed on two sides of the bottom plate 112. The metal conductive layer 1121 can be disposed between the through hole via 1123 and the bottom plate 112.

Similarly, the cover 106, the protective element 104, and the bottom plate 112 can form the accommodating space AS configured to accommodate the sensing element 102, and an opening 1061 is formed on the cover 106 to allow the sensing element 102 to sense the conditions of the environment in which the sensor 100A is located.

The sensor 100A in this embodiment may also include the thin film element 110 disposed between the cover 106 and the bottom plate 112, and the thin film element 110 is disposed on the cover 106 and covers the opening 1061. That is, the thin film element 110 is located in the accommodating space AS. It should be noted that in some embodiments, the thin film element 110 of the sensor may be omitted.

In addition, as shown in FIG. 4, the sensor 100A further includes two connecting ends 120 connected to the two traces 108, respectively. Each of the connecting ends 120 may include a pad 121, a bump 123, and a conductive paste 125. The pad 121 may include a portion of the metal conductive layer 1121 and the through hole via 1123. The trace 108 may be directly formed by using additive manufacturing technology and electrically connected to the metal conductive layer 1121 of the pad 121, or may be connected to the metal conductive layer 1121 of the pad 121 by solder. The bump 123 is fixedly connected to the metal conductive layer 1121 under the pad 121, the conductive paste 125 is fixedly connected to the bump 123, and the conductive paste 125 can be connected to the pins 24 of the integrated circuit chip 20. In other embodiments, the through hole via 1123 can be filled with a metal, which may be the same as or different than the metal conductive layer 1121.

It should be noted that, in this embodiment, the two connecting ends 120 and the sensing element 102 (or the cover 106) are located on opposite sides of the bottom plate 112.

In this embodiment, the conductive paste 125 may be an anisotropic conductive film (ACF). As shown in FIG. 4 and FIG. 5, when the sensor 100A is to be added on the integrated circuit chip 20, the bottom plate 112 is disposed on the top surface 22T, and the conductive paste 125 is disposed on the pins 24. After the heating and pressuring process, the conductive paste 125 can be connected to the pins 24 and electrically connected to the pins 24, so that the sensing element 102 can be electrically connected to the pins 24 via the traces 108 and the connecting ends 120. In addition, in other embodiments, the conductive paste 125 may be replaced by solder or conductive slurry.

Figure 6:
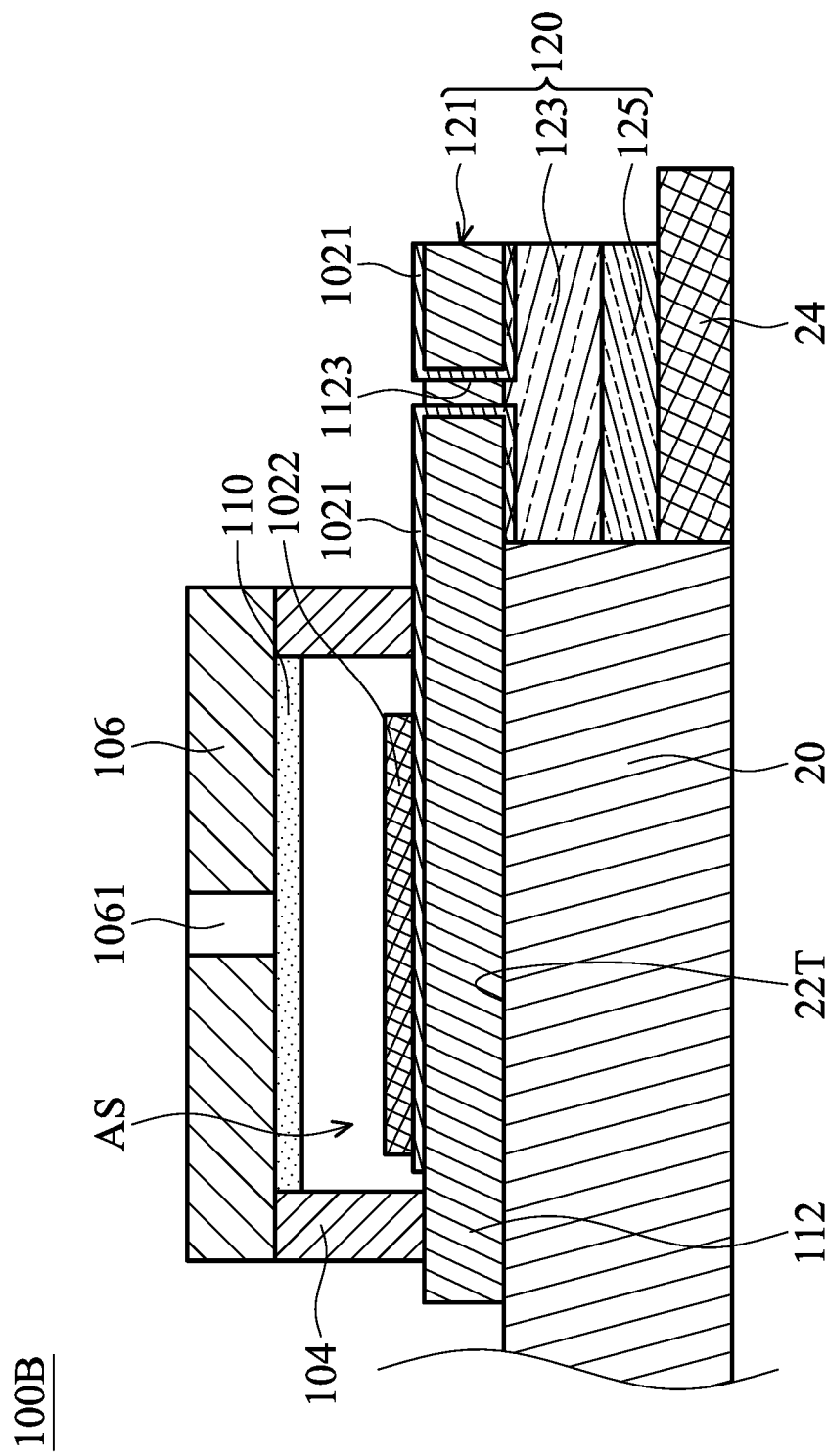
FIG. 6 is a side view of a sensor 100B according to an embodiment of the present disclosure.
Figure 7:
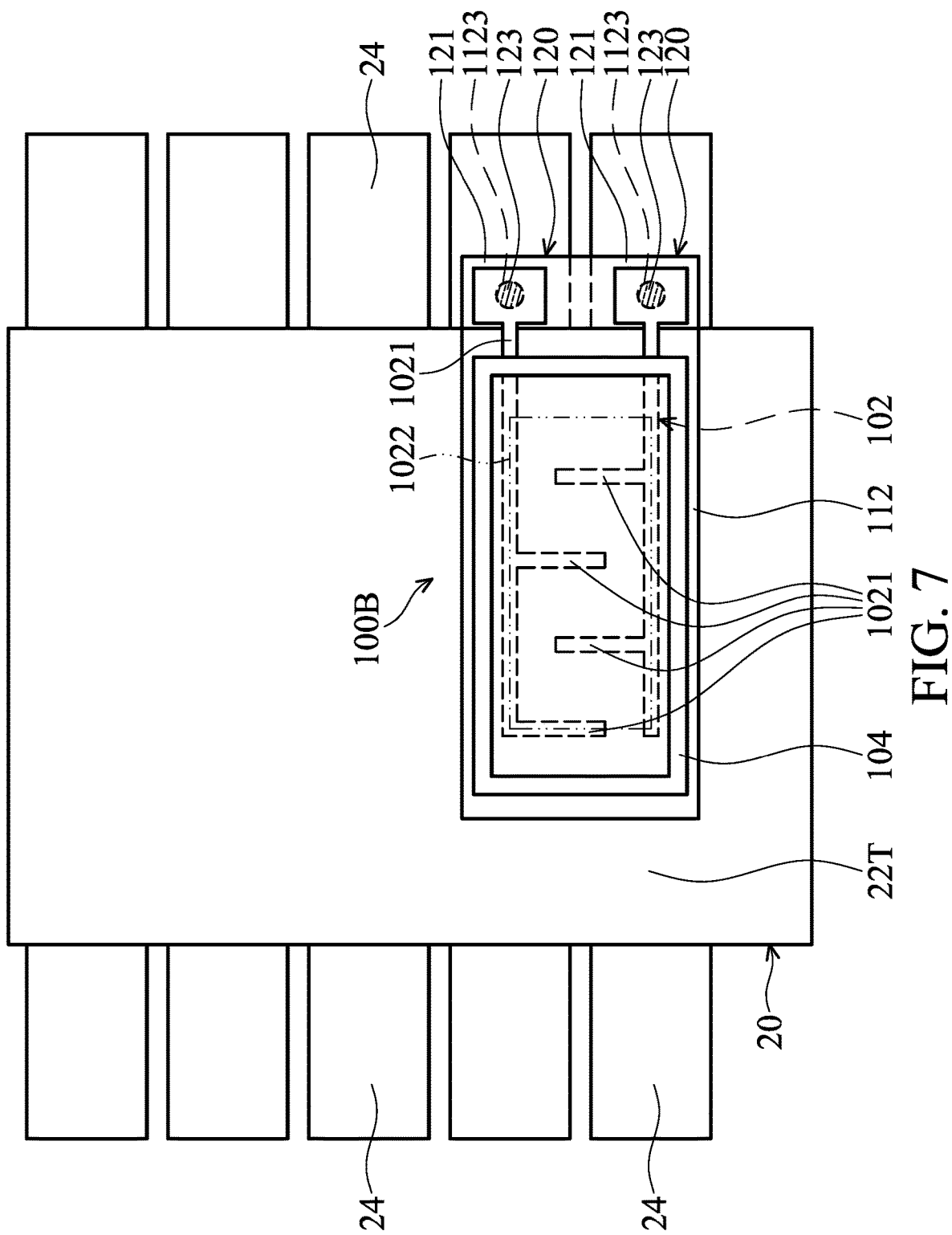
FIG. 7 is a diagram of the sensor 100B disposed on the top surface 22T of the integrated circuit chip 20 according to an embodiment of the present disclosure.

Please refer to FIG. 6 and FIG. 7. FIG. 6 is a side view of a sensor 100B according to an embodiment of the present disclosure, and FIG. 7 is a diagram of the sensor 100B disposed on the top surface 22T of the integrated circuit chip 20 according to an embodiment of the present disclosure. The sensor 100B in this embodiment is similar to the sensor 100A, and the difference between them is that the sensing element 102 in this embodiment includes a plurality of wires 1021 and a sensing layer 1022 on the bottom plate 112, and the sensing layer 1022 is electrically connected to the wire 1021.

Furthermore, as shown in FIG. 6, the wires 1021 can extend to the connecting ends 120 to form a structure that is similar to the metal conductive layer 1121 and the through hole via 1123 in FIG. 4, and the wire 1021 is disposed between the through hole via 1123 and the bottom plate 112. Similarly, the through hole via 1123 can be filled with a metal, which may be the same as or different than the wires 1021.

Figure 8:
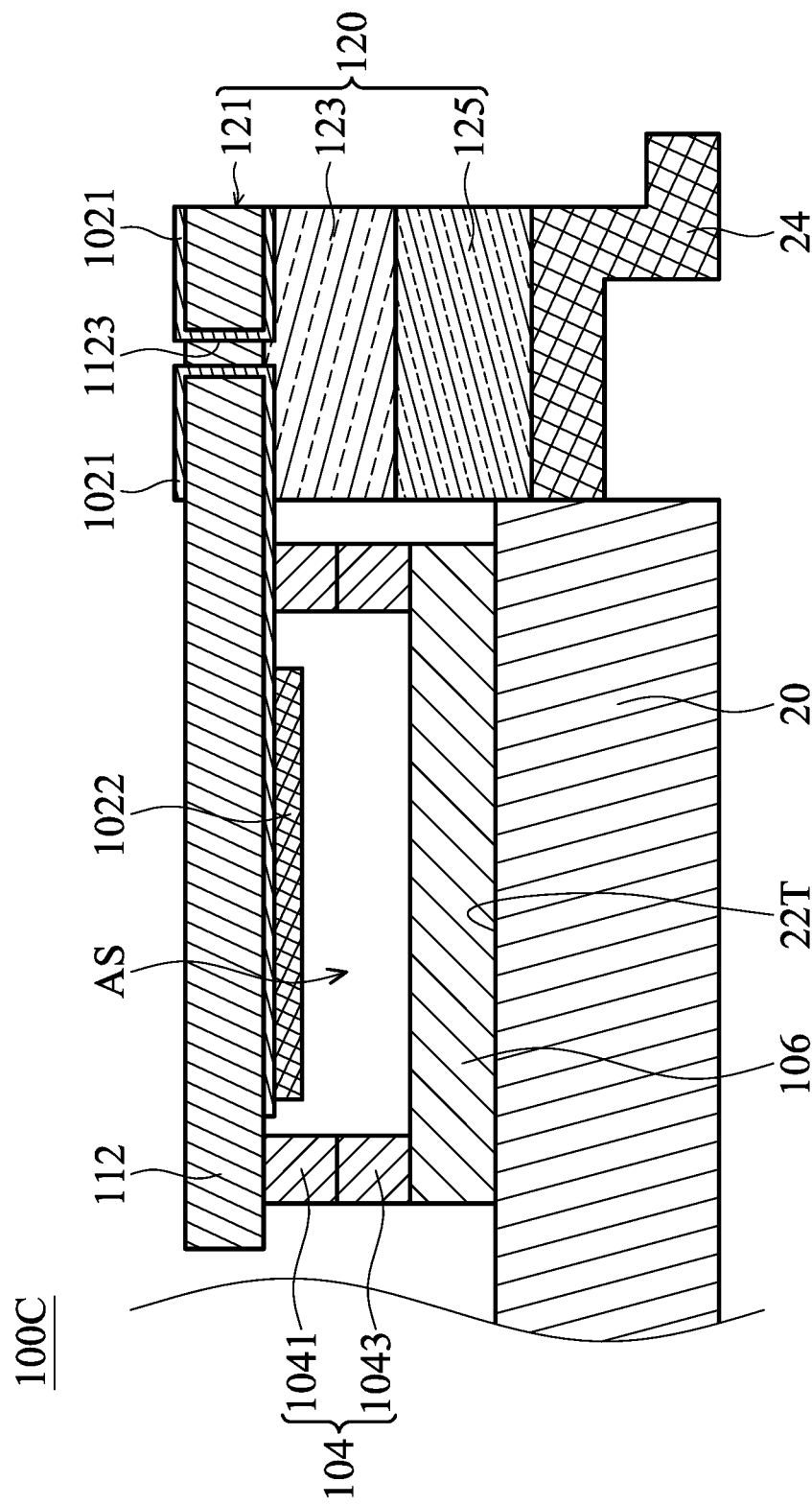
FIG. 8 is a side view of a sensor 100C according to an embodiment of the present disclosure.
Figure 9:
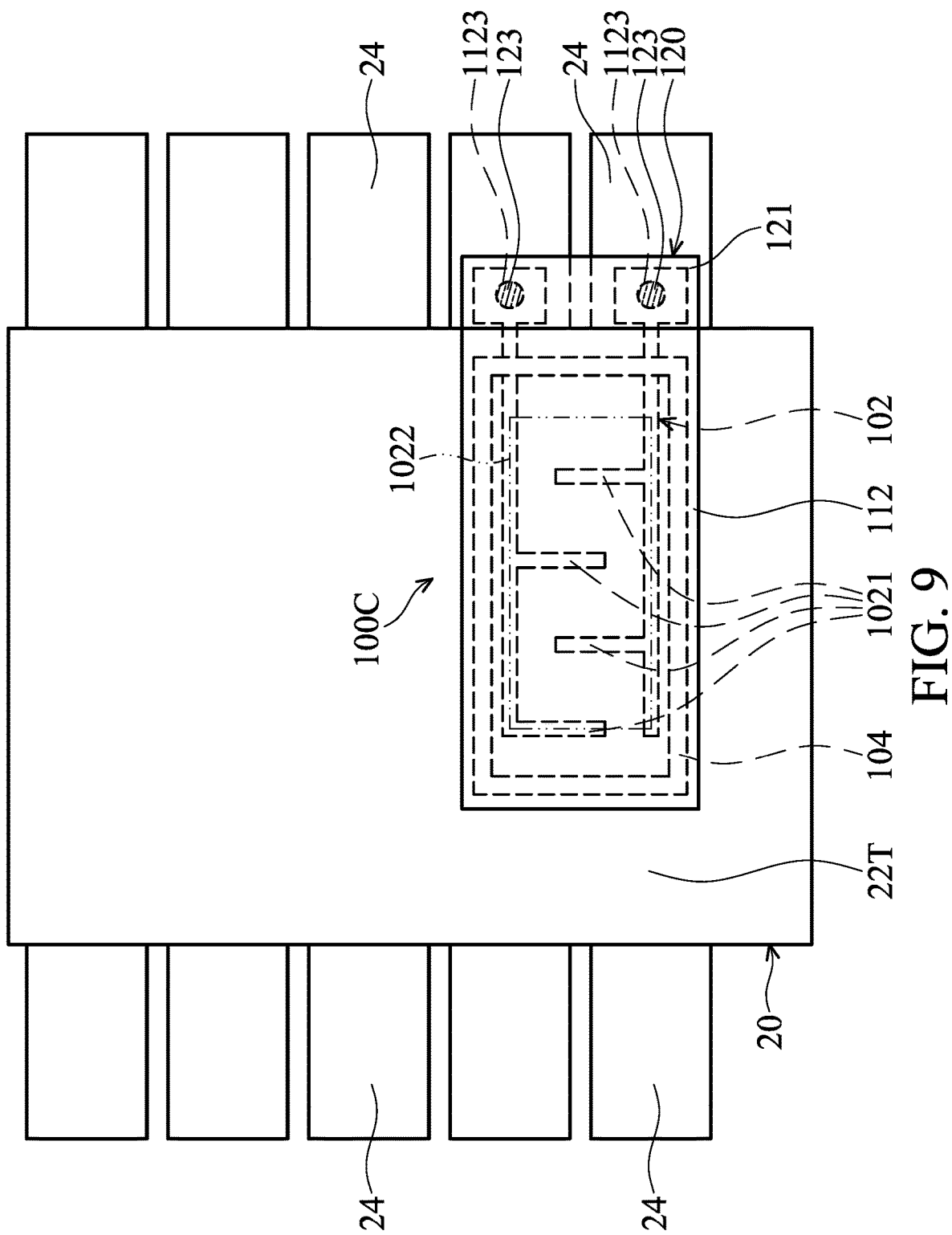
FIG. 9 is a diagram of the sensor 100C disposed on the top surface 22T of the integrated circuit chip 20 according to an embodiment of the present disclosure.

Please refer to FIG. 8 and FIG. 9. FIG. 8 is a side view of a sensor 100C according to an embodiment of the present disclosure, and FIG. 9 is a diagram of the sensor 100C disposed on the top surface 22T of the integrated circuit chip 20 according to an embodiment of the present disclosure. In this embodiment, the sensor 100C includes the aforementioned bottom plate 112, the protective element 104, the cover 106, and the connecting ends 120. In this embodiment, the sensing element 102 is formed by a plurality of wires 1021 and the sensing layer 1022. Furthermore, as shown in FIG. 8, the wires 1021 can extend to the connecting ends 120 to form a structure that is similar to the metal conductive layer 1121 and the through hole via 1123 in FIG. 4, and the through hole via 1123 can also be filled with metal, which may be the same as or different than the wires 1021.

The cover 106, the protective element 104, and the bottom plate 112 form an accommodating space AS configured to accommodate the sensing element 102, and the two connecting ends 120 and the cover 106 are located on the same side of the bottom plate 112.

Specifically, the protective element 104 in this embodiment may include a connecting portion 1041 and a thin film element 1043. The connecting portion 1041 is fixedly disposed on the bottom plate 112, and the thin film element 1043 is connected between the connecting portion 1041 and the cover 106. The material of the thin film element 1043 may be the same as the material of the thin film element 110 described above.

The thin film element 1043 and the connecting portion 1041 surround the wire 1021, and the thin film element 1043 has permeability, so that the sensing element 102 can sense the conditions of the outside environment through the thin film element 1043.

As shown in FIG. 8 and FIG. 9, when the sensor 100C is to be added on the integrated circuit chip 20, the cover 106 is disposed on the top surface 22T, and the conductive paste 125 is disposed on the pins 24. The rest of installation procedure is similar to the foregoing embodiment, and therefore is omitted herein.

Figure 10:
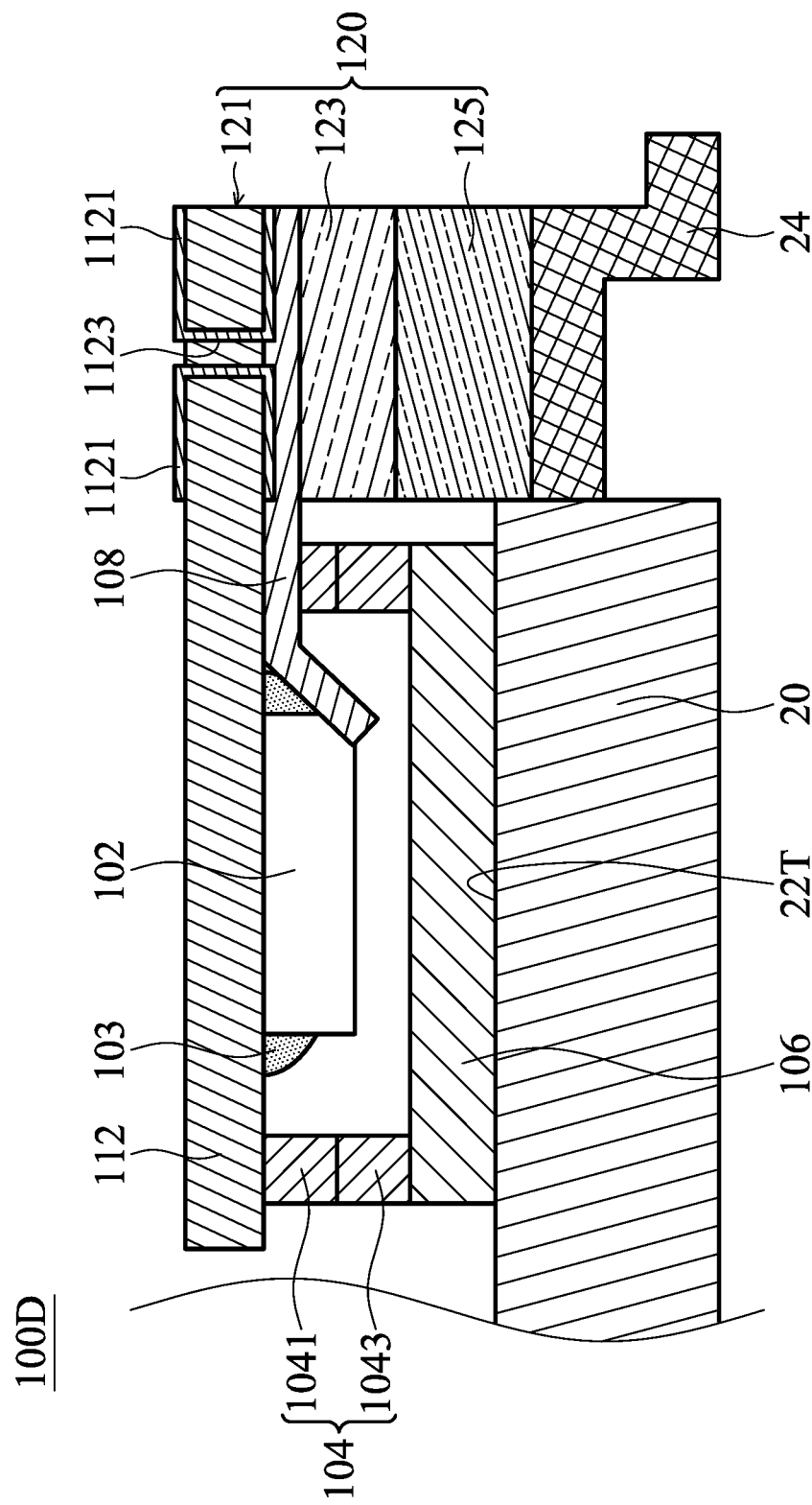
FIG. 10 is a side view of a sensor 100D according to an embodiment of the present disclosure.

Please refer to FIG. 10, which is a side view of a sensor 100D according to an embodiment of the present disclosure. The sensor 100D in this embodiment is similar to the sensor 100C, and the difference between them is that the sensing element 102 in this embodiment is a die, and the bottom plate 112 is configured to support the sensing element 102 and is connected to the protective element 104.

Similar to the embodiment of FIG. 4, the pad 121 may include a portion of the metal conductive layer 1121 and the through hole via 1123. The trace 108 may be directly formed by using additive manufacturing technology and is electrically connected to the sensing element 102 and the metal conductive layer 1121 of the pad 121.

Figure 11:
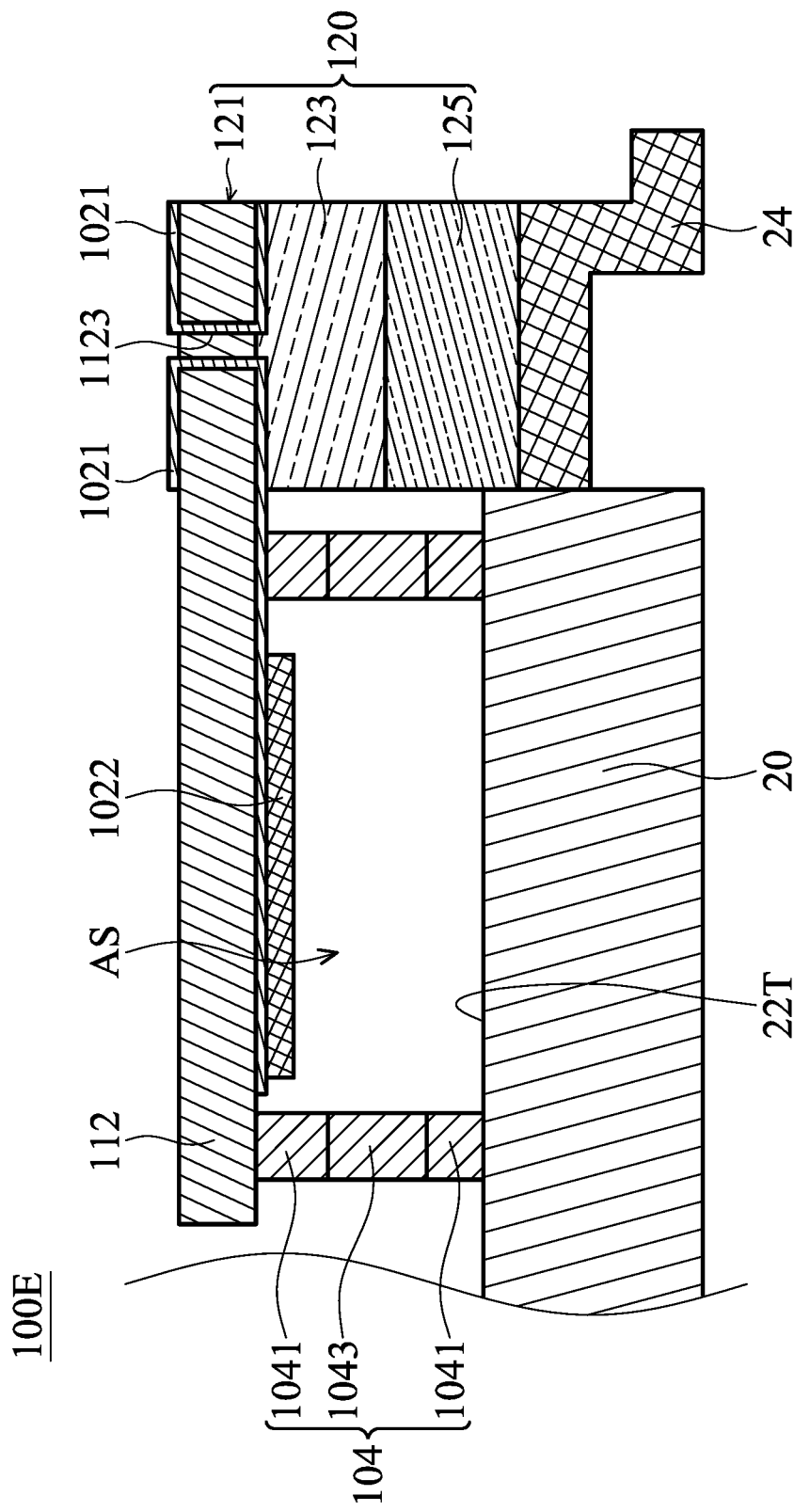
FIG. 11 is a side view of a sensor 100E according to an embodiment of the present disclosure.

Please refer to FIG. 11, which is a side view of a sensor 100E disposed on the top surface 22T of the integrated circuit chip 20 according to an embodiment of the present disclosure. The sensor 100E in this embodiment is similar to the sensor 100C, and the difference between them is that the sensor 100E in this embodiment omits the cover 106, and the protective element 104 is connected between the bottom plate 112 and the top surface 22T of the package body 22. The protective element 104, the bottom plate 112, and the package body 22 form the accommodating space AS configured to accommodate the sensing element 102 (including a plurality of wires 1021 and the sensing layer 1022, wherein the wires 1021 can extend to the connecting end 120 to form a structure that is similar to the metal conductive layer 1121 and the through hole via 1123 in FIG. 4).

Similarly, the protective element 104 includes the connecting portion 1041 and the thin film element 1043. The connecting portion 1041 is fixedly disposed on the bottom plate 112 and the package body 22, and the thin film element 1043 is connected to the connecting portion 1041 and surrounds the sensing element 102. Furthermore, the thin film element 1043 is located in the connecting portion 1041.

It should be noted that the two connecting ends 120 and the sensing element 102 are located on the same side of the bottom plate 112. Furthermore, because the cover 106 is omitted, the volume of the sensor 100E is further reduced, and the purpose of miniaturization is achieved.

Figure 12:
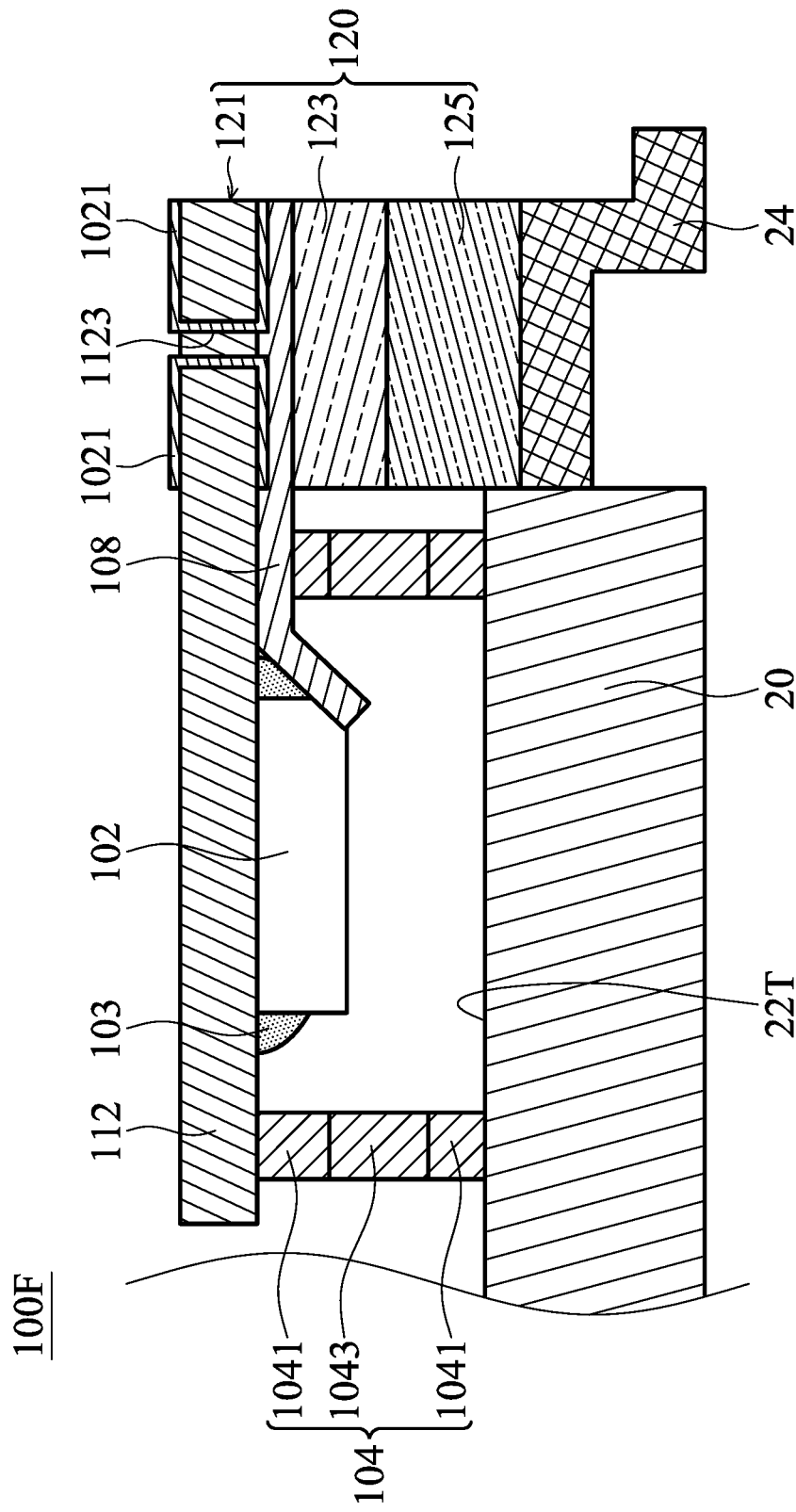
FIG. 12 is a side view of a sensor 100F according to an embodiment of the present disclosure.

Please refer to FIG. 12, which is a side view of a sensor 100F disposed on the top surface 22T of the integrated circuit chip 20 according to an embodiment of the present disclosure. The sensor 100F in this embodiment is similar to the sensor 100E, and the difference between them is that the sensing element 102 of the sensor 100F in this embodiment is a die, and the bottom plate 112 is configured to support the sensing element 102 and is connected to the protective element 104.

Please refer to FIG. 12, FIG. 13A to FIG. 13F. FIG. 13A to FIG. 13F are diagrams illustrating that the protective element 104 of a sensor is disposed on the top surface 22T of the integrated circuit chip 20 according to an embodiment of the present disclosure. In this embodiment, the protective element 104 of the sensor 100F of FIG. 12 can also be implemented as the protective element 104 in FIG. 13A. The protective element 104 includes a connecting portion 1041, a thin film element 1043, and a thin film element 1045. The thin film elements 1043 and 1045 can be made out of paper, glass fibers, metal oxides, polypropylene (PP), nanocellulose, cellulose acetate (CA), polysulfone (PSU), fluoropolymer, polyvinylamine, polyamide (PA), polyimide (PI), polyfuran (PFu), polydimethylsiloxane (PDMS), poly [1-(trimethylsilyl)-1-propyne] (PTMSP), or a combination thereof. The connecting portion 1041 surrounds the sensing element 102 and forms a rectangular structure. The connecting portion 1041 has two openings 104A, 104B located on opposite sides of the rectangular structure, and the thin film elements 1043, 1045 are respectively disposed in the two openings 104A, 104B, so as to cooperate with the bottom plate 112 and the top surface 22T to form an enclosed accommodating space AS.

In this embodiment, the arrangement direction of the opening 104A and the opening 104B is substantially the same as the arrangement direction of the plurality of pins 24, for example, along the Y-axis. The opening 104A and the opening 104B respectively have a width W1 and a width W2, and the width W1 is equal to the width W2 in FIG. 13. The sensing element 102 can sense the conditions of the outside environment by the permeability of the thin film element 1043 and the thin film element 1045.

Figure 13B:
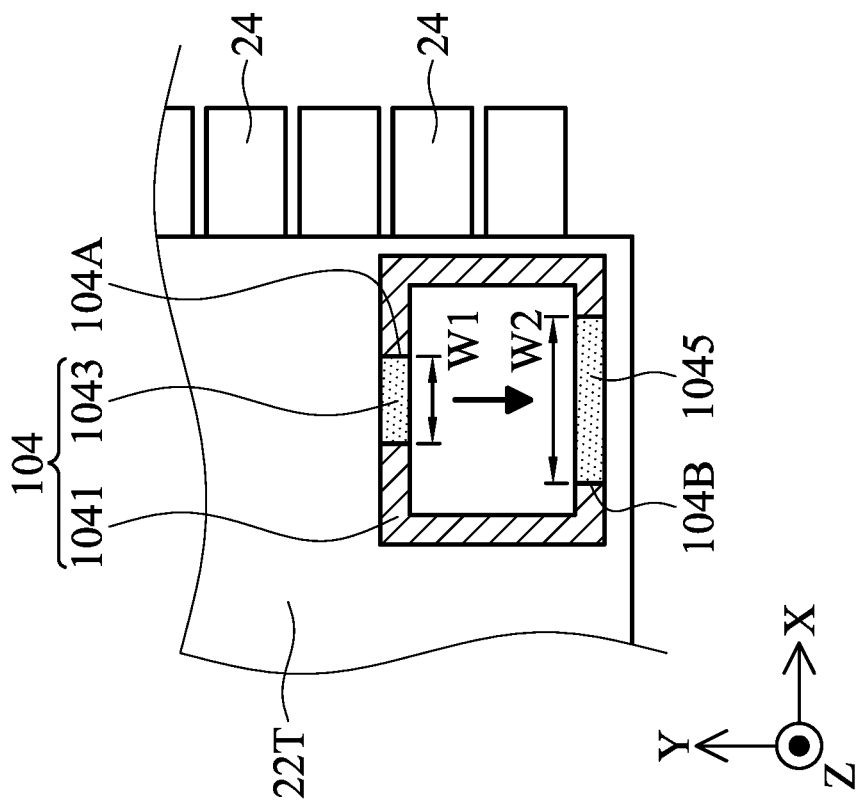
FIG. 13A to FIG. 13F are diagrams illustrating that the protective element 104 of a sensor is disposed on the top surface 22T of the integrated circuit chip 20 according to an embodiment of the present disclosure.
Figure 13A:
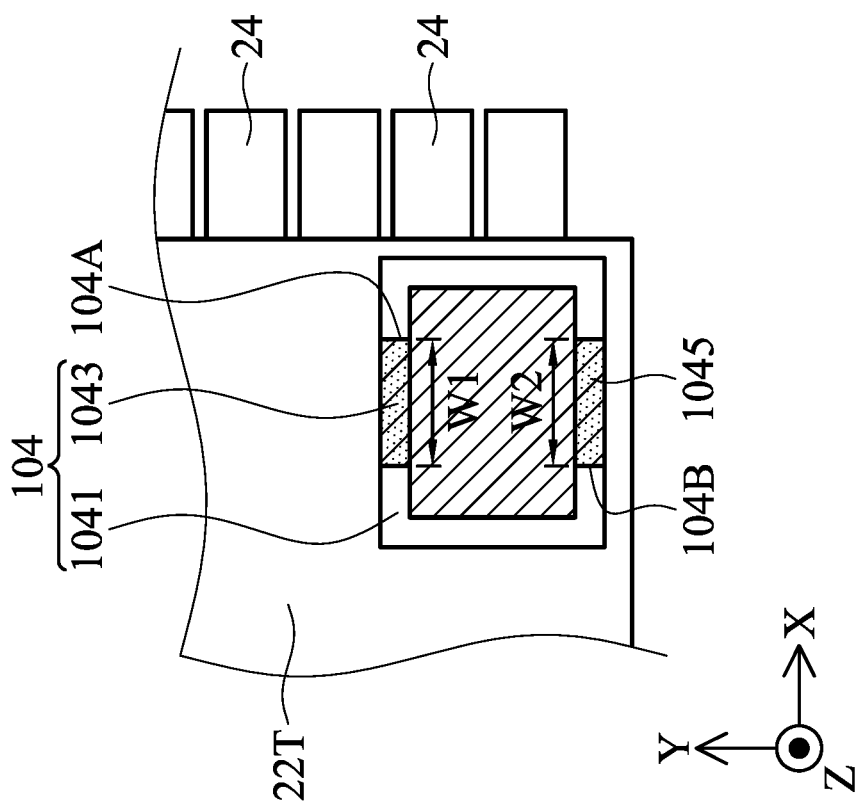

Next, in FIG. 13B, the size of the opening 104A and the opening 104B are different. Specifically, the width W1 is smaller than the width W2. Such structural design can be matched to the environment in which the sensor and integrated circuit chip 20 are located. For example, when the sensor is disposed in an electronic device (such as a smart phone), the temperature near the opening 104A is higher (or the pressure is high), and the temperature near the opening 104B is lower (or the pressure is low), so that the air flow in the electronic device flows from the opening 104A to the opening 104B along the Y-axis (as indicated by the arrow in the figures) so that the sensing element 102 can effectively sense the conditions of the outside environment.

Figure 13D:
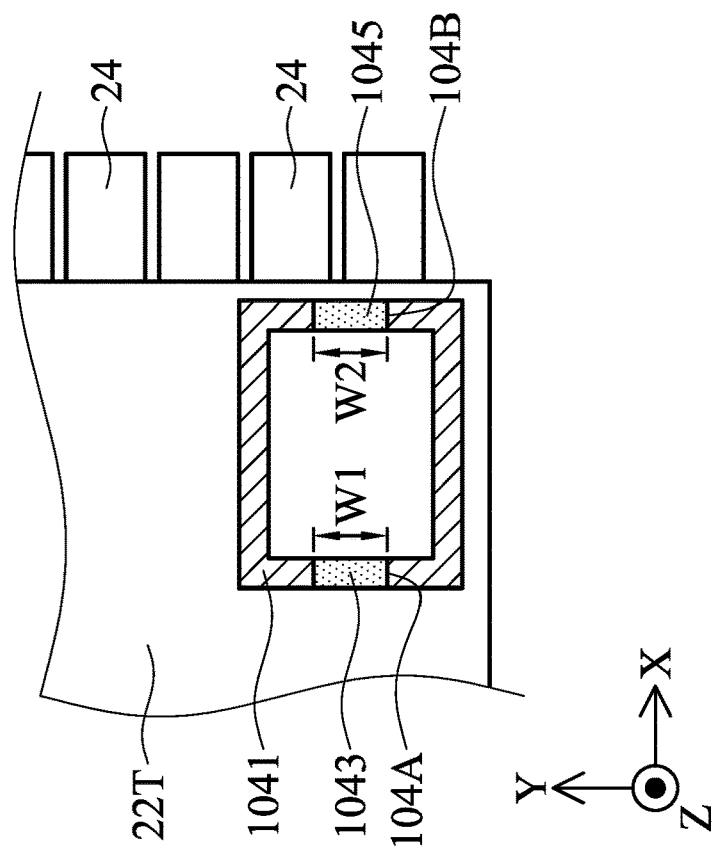
Figure 13C:
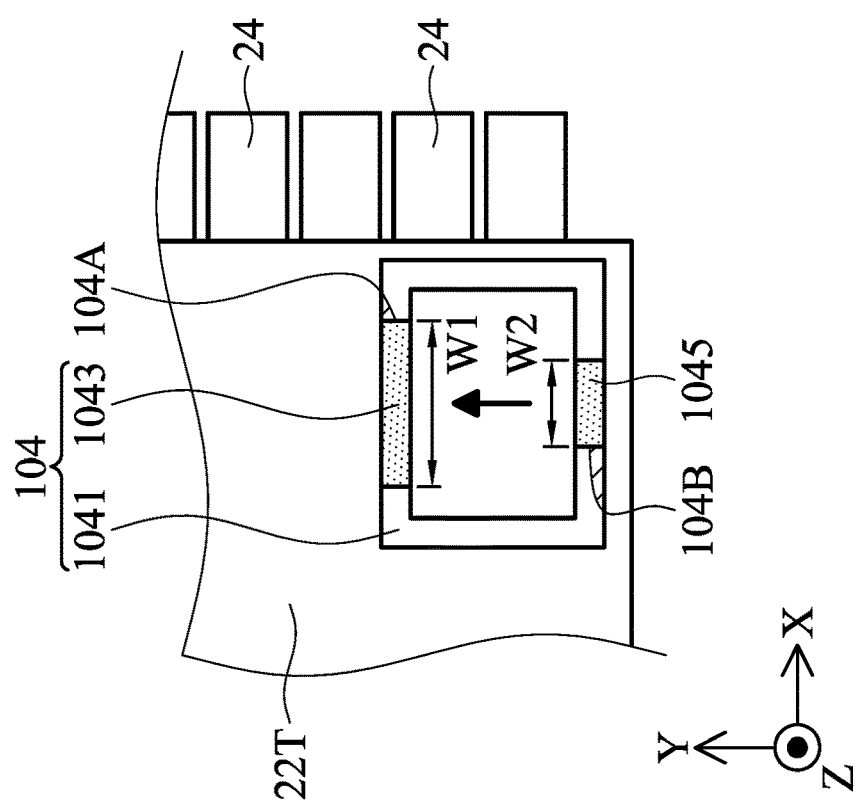

In FIG. 13C, the width W1 is greater than the width W2. When the temperature near the opening 104A is lower (or the pressure is lower) and the temperature near the opening 104B is higher (or the pressure is higher), based on this structural design, the airflow in the electronic device flows from the opening 104B to the opening 104A along the Y-axis so that the sensing element 102 can effectively sense the conditions of the outside environment.

Next, in FIG. 13D, the arrangement direction of the opening 104A and the opening 104B is substantially different from the arrangement direction of the plurality of pins 24, for example, along the X-axis. Furthermore, sizes of the openings 104A and the openings 104B are the same.

Figure 13E:
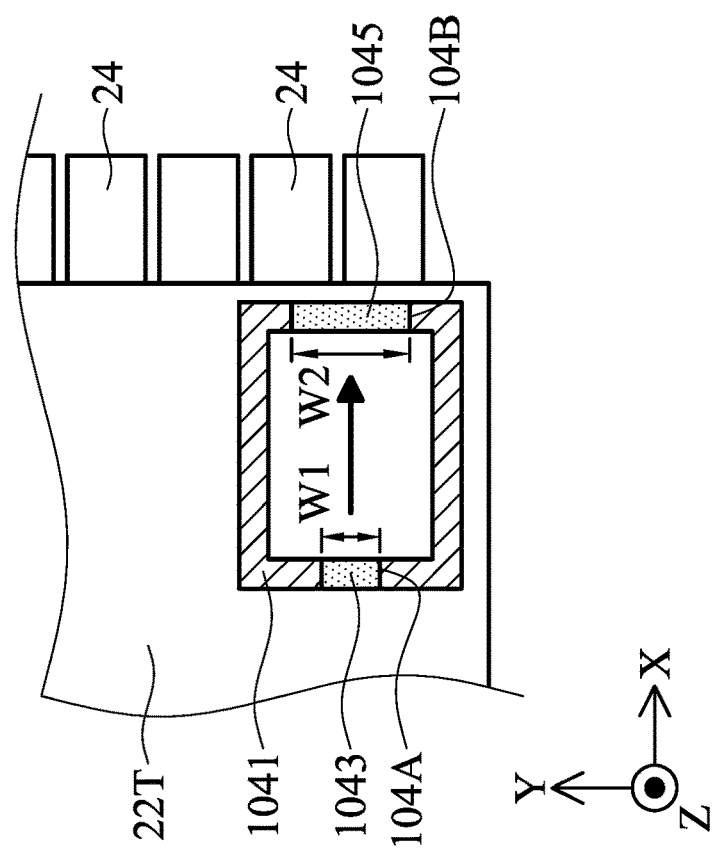

Next, in FIG. 13E, the sizes of the opening 104A and the opening 104B are different, and the width W1 is smaller than the width W2. When the temperature near the opening 104A is higher (or the pressure is higher) and the temperature near the opening 104B is lower (or the pressure is lower), based on this structural design, the airflow in the electronic device flows from the opening 104A to the opening 104B along the X-axis so that the sensing element 102 can effectively sense the conditions of the outside environment.

Figure 13F:
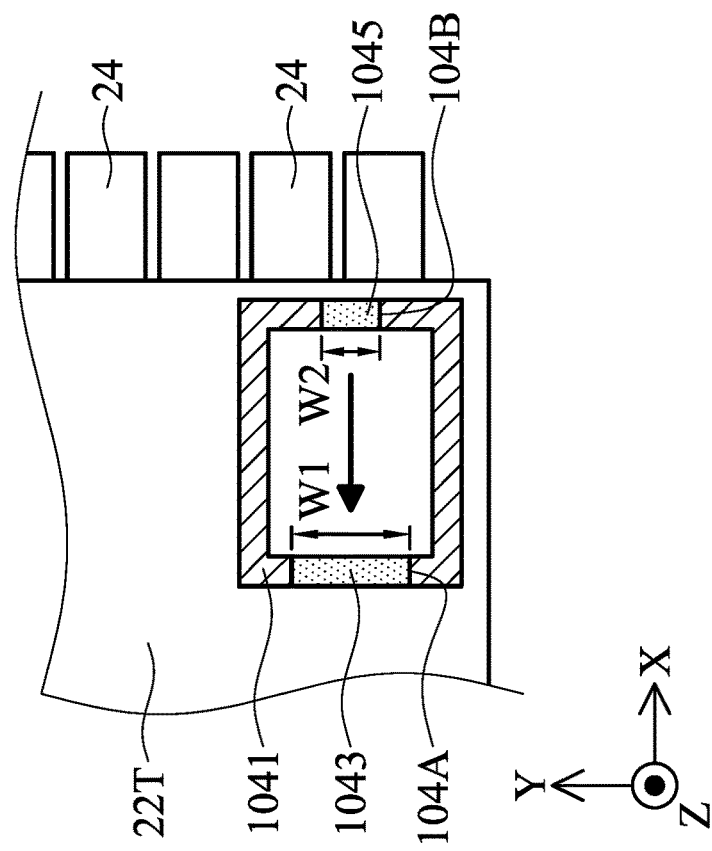

In FIG. 13F, the width W1 is greater than the width W2. When the temperature near the opening 104A is lower (or the pressure is lower) and the temperature near the opening 104B is higher (or the pressure is higher), based on this structural design, the airflow in the electronic device flows from the opening 104B to the opening 104A along the X-axis so that the sensing element 102 can effectively sense the conditions of the outside environment.

The size and arrangement direction of the opening 104A and the opening 104B may be adjusted according to the circuit layout of the integrated circuit chip 20 in the electronic device, so that the sensing element 102 can more accurately sense the conditions of the environment in which the integrated circuit chip 20 is located. Furthermore, the design of the protective element 104 in FIG. 13A to FIG. 13F can also be implemented in other embodiments of the present disclosure.

The present disclosure provides a modular sensor that is detachably attached to an integrated circuit chip 20, such as on the package body 22 of the integrated circuit chip 20. Because the sensor is detachably attached to the integrated circuit chip 20, that is, it is not necessary to use a special packaging to bond the integrated circuit chip 20 and the sensor. Therefore, the sensor of the present disclosure not only can be protected well, but also the original size of the integrated circuit chip 20 can be maintained, so as to achieve the purpose of miniaturization.

In addition, when the sensor malfunctions, the faulty sensor can easily be replaced with a new sensor. Therefore, the sensor of the present disclosure has the advantages of cost saving and replacement convenience as compared with the conventional special packaging sensor.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein can be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A sensor, disposed on a package body of an integrated circuit chip, comprising:
    a sensing element, disposed on the integrated circuit chip;
    a protective element, disposed on the package body of the integrated circuit chip and surrounding the sensing element;
    a cover, connected to the protective element; and
    at least two traces, electrically connected to the sensing element and at least two pins of the integrated circuit chip;
    wherein a portion of the package body is exposed by the protective element and the cover.

2. The sensor as claimed in claim 1, wherein the sensor further includes two connecting ends respectively connected to the two traces, wherein each of the connecting ends includes a pad, a bump, and a conductive paste, the trace is connected to the pad, the bump is connected to the pad, and the conductive paste is connected to the bump and one pin of the integrated circuit chip.

3. The sensor as claimed in claim 2, wherein the sensor further includes a bottom plate configured to support the sensing element and connected to the protective element, an accommodating space is formed by the cover, the protective element and the bottom plate to accommodate the sensing element, and an opening is formed on the cover.

4. The sensor as claimed in claim 3, wherein the sensor further includes a thin film element disposed between the cover and the bottom plate, and the thin film element is disposed on the cover and covers the opening.

5. The sensor as claimed in claim 3, wherein the two connecting ends and the sensing element are located on opposite sides of the bottom plate.

6. The sensor as claimed in claim 2, wherein the sensor further includes a bottom plate configured to support the sensing element and connected to the protective element, an accommodating space is formed by the cover, the protective element and the bottom plate to accommodate the sensing element, and the two connecting ends and the sensing element are located on a same side of the bottom plate.

7. The sensor as claimed in claim 6, wherein the protective element includes a connecting portion and a thin film element, the connecting portion is disposed on the bottom plate, and the thin film element is connected between the connecting portion and the cover.

8. The sensor as claimed in claim 6, wherein the protective element includes a connecting portion and two thin film elements, the connecting portion has a rectangular structure and two openings which are located on opposite sides of the rectangular structure, and the two thin film elements are respectively disposed in the two openings.

9. The sensor as claimed in claim 1, wherein the sensing element includes a die or a plurality of wires.

10. An integrated circuit module, comprising:
    a integrated circuit chip, having a package body and at least two pins; and
    a sensor, disposed on the integrated circuit chip, the sensor comprising:
        a bottom plate;
        a sensing element, disposed on the bottom plate;
        a protective element, disposed on the bottom plate and surrounding the sensing element;

at least two traces, connected to the sensing element; and two connecting ends, electrically connected to the at least two traces;

wherein the two connecting ends are configured to be connected to the at least two pins of the integrated circuit chip.

11. The integrated circuit module as claimed in claim 10, wherein the protective element is connected between the bottom plate and the package body, and the protective element, the bottom plate and the package body form an accommodating space to accommodate the sensing element.

12. The integrated circuit module as claimed in claim 11, wherein the protective element includes a connecting portion and a thin film element, the connecting portion is disposed on the bottom plate, and the thin film element is connected to the connecting portion and is located in the connecting portion.

13. The integrated circuit module as claimed in claim 11, wherein the protective element includes a connecting portion and two thin film elements, the connecting portion has a rectangular structure and two openings which are located on opposite sides of the rectangular structure, and the two thin film elements are respectively disposed in the two openings.

14. The integrated circuit module as claimed in claim 13, wherein the sizes of the two openings are different.

15. The integrated circuit module as claimed in claim 13, wherein an arrangement direction of the two openings is substantially the same as an arrangement direction of the two pins.

16. The integrated circuit module as claimed in claim 13, wherein an arrangement direction of the two openings is substantially different from an arrangement direction of the two pins.

17. The integrated circuit module as claimed in claim 13, wherein the thin film element is made out of paper, glass fibers, metal oxides, polypropylene (PP), nanocellulose, cellulose acetate (CA), polysulfone (PSU), fluoropolymer, polyvinylamine, polyamide (PA), polyimide (PI), polyfuran (PFu), polydimethylsiloxane (PDMS), poly [1-(trimethylsilyl)-1-propyne] (PTMSP), or a combination thereof.

18. The integrated circuit module as claimed in claim 10, wherein the two connecting ends and the sensing element are located on a same side of the bottom plate.

19. The integrated circuit module as claimed in claim 10, wherein the sensing element includes a die or a plurality of wires.

20. The integrated circuit module as claimed in claim 10, wherein each of the connecting ends includes a pad, a bump, and a conductive paste, the trace is connected to the pad, the bump is connected to the pad, and the conductive paste is connected to the bump and one of the two pins.

* * * * *